United States Patent [19]

Young

[11] Patent Number: 5,216,366

[45] Date of Patent: Jun. 1, 1993

[54] METHODS AND APPARATUS FOR INVESTIGATING THE COMPOSITION OF MATERIAL

[75] Inventor: Ian R. Young, West Overton, England

[73] Assignee: The General Electric Company, p.l.c., England

[21] Appl. No.: 670,949

[22] Filed: Mar. 18, 1991

[30] Foreign Application Priority Data

Apr. 9, 1990 [GB] United Kingdom ............... 9008002

[51] Int. Cl.⁵ .......................................... G01R 33/20
[52] U.S. Cl. .................................. 324/307; 324/300; 324/318
[58] Field of Search ............... 324/303, 306, 300, 307, 324/309, 308

[56] References Cited

U.S. PATENT DOCUMENTS

| | | | |
|---|---|---|---|
| 4,390,957 | 6/1983 | Skarlos et al. | 324/300 |
| 4,638,251 | 1/1987 | King | 324/306 |
| 4,701,705 | 10/1987 | Rollwitz | 324/306 |
| 4,769,602 | 9/1988 | Vinegar et al. | 324/303 |
| 4,795,245 | 11/1988 | Lew et al. | 324/308 |
| 4,866,385 | 9/1989 | Reichwein | 324/306 |
| 5,095,271 | 3/1992 | Ohkawa | 324/307 |
| 5,132,903 | 7/1992 | Sinclair | 324/318 |

FOREIGN PATENT DOCUMENTS 1303916 4/1987 U.S.S.R. .

OTHER PUBLICATIONS

Webster's New World Dictionary—3rd College Ed p. 419.
Radiology, "Simple Proton Spectroscopic Imaging", by W. Thomas Dixon, 153, 1984, pp. 189–194.
J. Comput. Assist. Tomogr., "MR Imaging: Clinical use of the Inversion Recovery Sequence", by G. M. Bydder, et al. 9 (6), 1985, pp. 659–675.
Magnetic Resonance Imaging, 1, 1982, "A flow velocity zeugmatographic interlace for NMR imaging in humans", by P. R. Moran, pp. 197–203.
J. Comput. Assist., Tomogr., 8 (4), 1924, "Measurement of flow with NMR Imaging using a gradient pulse and phase difference technique", by D. J. Bryant et al., pp. 588–593.
IBM Technical Disclosure Bulletin, vol. 32, No. 6B, Nov. 1989, New York, U.S., pp. 9–11.
Physics in Medicine and Biology, vol. 30, No. 4, Apr. 1985, London, GB, pp. 341–344, A. Haase et al.
Magnetic Resonance in Medicine, vol. 5, No. 1, Jul. 1987, Diluth, MN, U.S., pp. 83–86, J. A. B. Lohman et al.
Magnetic Resonance in Medicine, vol. 13, No. 3, Mar. 1990, Duluth, MN, U.S., pp. 398–406, J. P. Hornak et al.
Journal of Magnetic Resonance, vol. 89, No. 3, Oct. 1990, Orlando, MN, U.S., pp. 470–478, P. D. Majors et al.

*Primary Examiner*—Michael J. Tokar
*Assistant Examiner*—Raymond Y. Mah
*Attorney, Agent, or Firm*—Kirschstein, Ottinger, Israel & Schiffmiller

[57] ABSTRACT

A method of determining the proportions of different components of material in a duct comprises exciting nuclear magnetic spins of nuclei of a species common to the components in a region of the duct and utilizing the resulting free induction decay (FID) signal. The nuclear spins are excited simultaneously in the components and the proportions are determined by measuring the phase of the FID signal relative to a phase datum. The method finds particular application for measuring the proportions of oil and water in material obtained from a subsea oil well.

8 Claims, 3 Drawing Sheets

METHODS AND APPARATUS FOR INVESTIGATITNG THE COMPOSITION OF MATERIAL

BACKGROUND OF THE INVENTION

This invention relates to methods and apparatus for investigating the composition of material.

More particularly the invention relates to such methods and apparatus for use in determining the proportions of different components in a material, more specifically in fluid form, flowing along a closed duct, such as a pipe, without physically interfering with the wall of the duct. One particular example of such a use is the investigation of the relative proportions of oil and water in material obtained from a sub-sea oil well.

SUMMARY OF THE INVENTION

IT is an object of the present invention to provide a novel method and apparatus for use in such an investigation.

According to the preset invention there is provided a method of determining the proportions of different components of a material in a duct comprising: exciting nuclear magnetic spins of nuclei of a species common to said components in a region of the duct; and utilizing the resulting free induction decay (FID) signals to determine said proportions.

In a first particular method according to the invention said nuclear spins are excited substantially simultaneously in said components, and said proportions are determined by deriving a signal representative of the resultant of the FID signals due to said components and measuring the phase of said derived signal relative to a datum.

In one such first particular method wherein there are two said components, said phase is measured by: effecting first and second excitation and measurement sequences under conditions such that he phase difference between signals respectively attributable to said two components nominally differs for said two sequences by a predetermined amount; and determining the value of the difference in the phase of said signal representative of the resultant for the two experiments as a fraction of said predetermined amount.

In a second particular method according to the invention nuclear magnetic spins are separately excited and the resulting FID measured for each said component at different times.

In one such second particular method nuclear spins are separately excited and the resulting FID measure for each component in turn by a sequence of steps comprising: exciting spins in the or each other component without exciting spins in that component; dephasing all spins excited in the material; exciting spins in said component and measuring the resultant FID signal.

The relative values of the signals measured in the different sequences clearly provides a measure of the proportions of the components in the material.

The invention also provides apparatus arranged to carry out a method according to the invention.

BRIEF DESCRIPTION OF THE DRAWINGS

Two methods in accordance with the invention and apparatus for carrying out the methods will now be described, by way of example, with reference to the accompanying drawings in which.

DETAILED DESCRIPTION OF THE PREFERRED EMBODIMENTS

Figure 1:
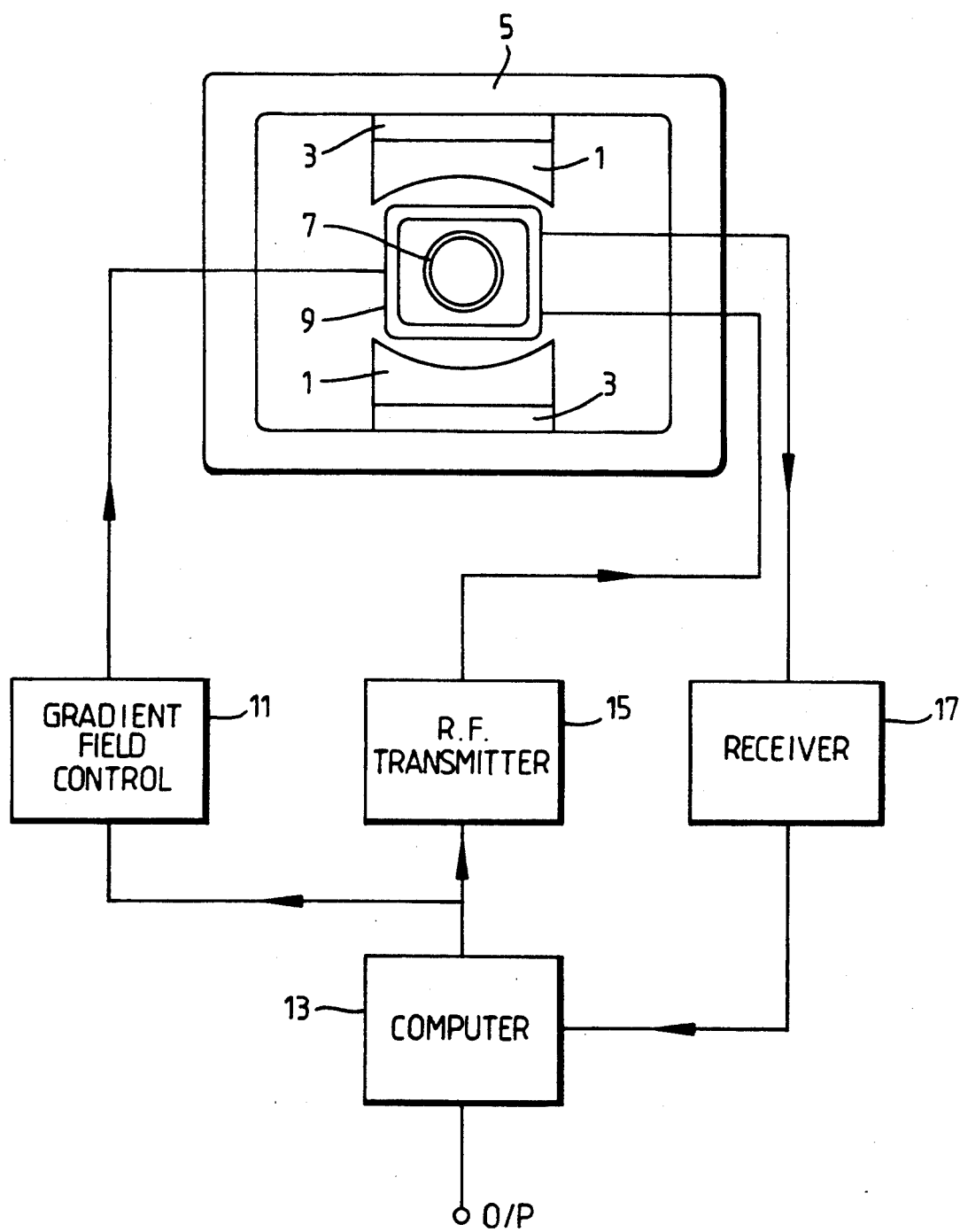
FIG. 1 is a block schematic diagram illustrating the basic parts of the apparatus.

Referring to FIG. 1, the apparatus includes a magnet arrangement which produces a strong uniform magnetic field Bo typically of strength 0.15T, across a gap between two pole pieces 1 each associated with a respective one of two permanent magnets 3, the faces of the magnets 3 remote from the pole pieces 1 being joined by a rectangular yoke 5.

Through the gap between the pole pieces 1 there extends a section of a pipeline 7 carrying an oil and water mixture, the section of the pipeline 7 within the gap consisting of a suitable non-magnetic, hydrogen-free material. Typically the pipeline 7 is a feed pipe from a sub-sea oil well installation, and is itself sub-sea.

It will be appreciated that the choice of a permanent magnet for the magnet arrangement, with consequent relatively low static field strength, arises from a requirement for sub-sea use.

The apparatus further includes a coil system 9 surrounding the section of the pipeline 7 within the gap between the pole pieces 1. The coil system 9 includes a first coil arrangement whereby a gradient may be imposed on the static magnetic field in the gap between the pole pieces 1 at least in one direction perpendicular to the length of the pipeline 7. Normally the gradient coil arrangement is arranged to be capable of applying a gradient in any one or more of three orthogonal directions. The gradient coil arrangement is energized by a gradient field control means 11 under control of a computer 13.

The coil system 9 further includes an r.f. transmitter coil arrangement and an r.f. receiver coil arrangement. The transmitter coil arrangement is connected with a transmitter 15 operated under the control of the computer 13 to apply r.f. field pulses to the section of the pipeline 7 in the gap between the pole pieces 1 for excitation of magnetic resonance in the material in the pipeline 7. R.f. signals resulting from magnetic resonance excited spins are sensed by the r.f. receiver coil arrangement and passed to a receiver 17 where they are detected. The detected signal are processed by the computer 13 to provide an output indicative of the proportions of oil and water in the material in the pipeline 7.

A first particular method according to the invention using the apparatus of FIG. 1 will now be described.

Figure 2:
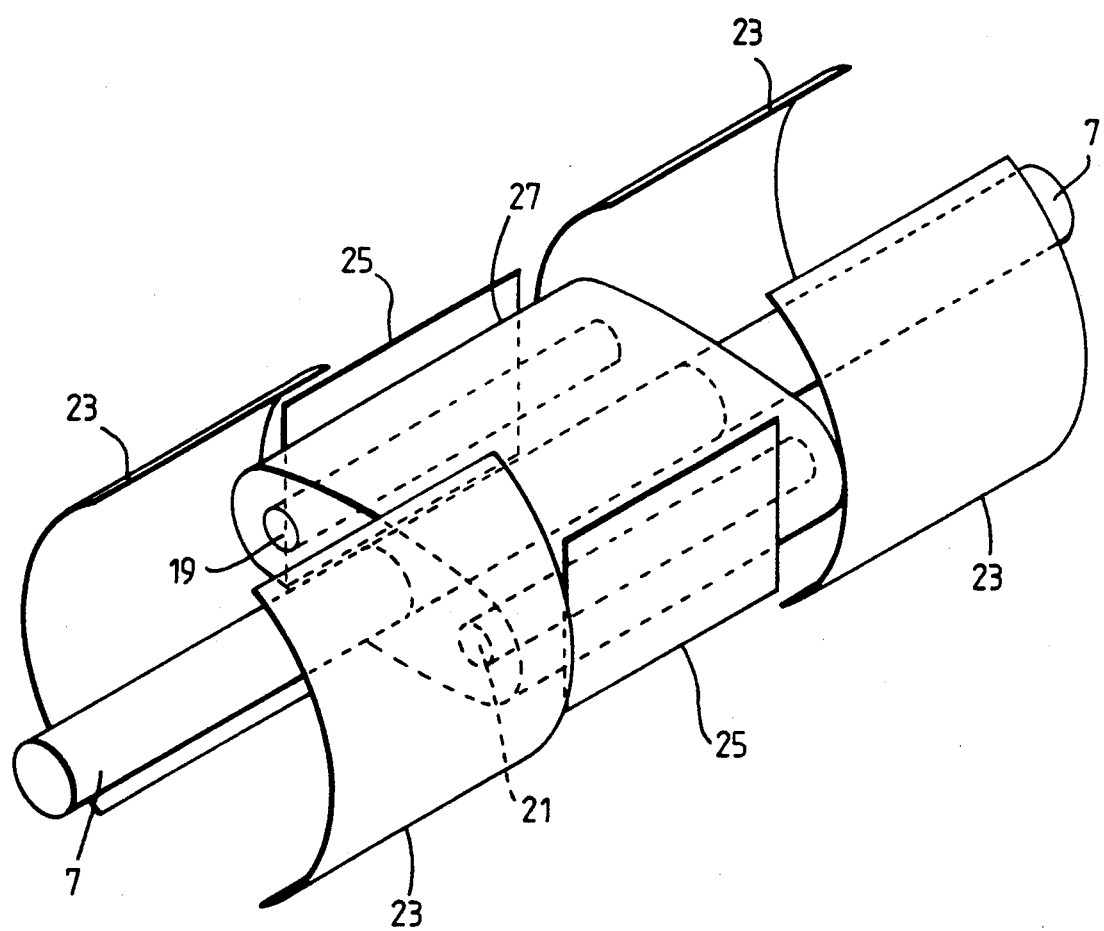
FIG. 2 shows in greater detail a coil arrangement of the apparatus of FIG. 1 when arranged for use in a first method.

Referring to FIG. 2 in this particular method there are positioned, one on either side of the pipeline 7, in the gap between the pole pieces 1 (not shown in FIG. 2), two cylindrical containers 19 and 21, one containing oil and the other water. The coil system 9 for this method comprises a four section gradient coil arrangement 23 which serves to impose a gradient on the static field Bo in a horizontal direction x, taking the pipeline axis to extend horizontally in the z-direction and the static field to be directed vertically in the y-direction. The transmitter coil arrangement of the coil system 9 comprises a Helmholtz coil pair whose coils 25 are disposed on opposite sides of the pipeline 7 and the containers 19 and 21 in the x-direction. The receiver coil arrangement of the coil system 9 comprises a helical solenoid coil 27 closely coaxially surrounding the pipeline 7 and embracing also the container 19 and 21.

In operation of the apparatus the field Bo provided by the magnet arrangement 1, 3, 5 defines an equilibrium axis of magnetic alignment.

In performance of the method an r.f. pulse if first applied to the pipeline 7 and containers 19 and 21 by means of the r.f. transmitter 15 and r.f. transmitter coils 25 to excite magnetic resonance in the oil and water in the containers 19, 21 and pipeline 7. To this end the coils 25 produce a field B1 in a direction orthogonal to the static field direction so as to tip the spins of hydrogen protons in the oil and in the water from their equilibrium axis into a plane orthogonal to the static field direction. For this to occur the r.f. field must be at the Larmor frequency for hydrogen protons in a magnetic field of the static field strength, and contain frequency components extending over a band broad enough to embrace the chemical shift of hydrogen protons between water and oil, in particular in $CH_2$ groups.

The r.f. signals resulting from excitation (see FIG. 3A) are then detected in the receiver 17 in the presence of a gradient applied by the gradient coil arrangement 25 to cause the spin frequency to vary in the x-direction and thereby encode the spins spatially in the x-direction.

Figure 3:
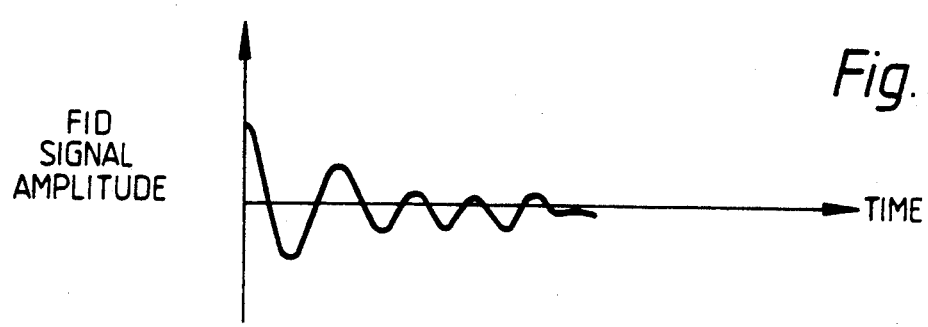
FIGS. 3A, B and C illustrate various signals obtained in carrying out the first method.
Figure 3:
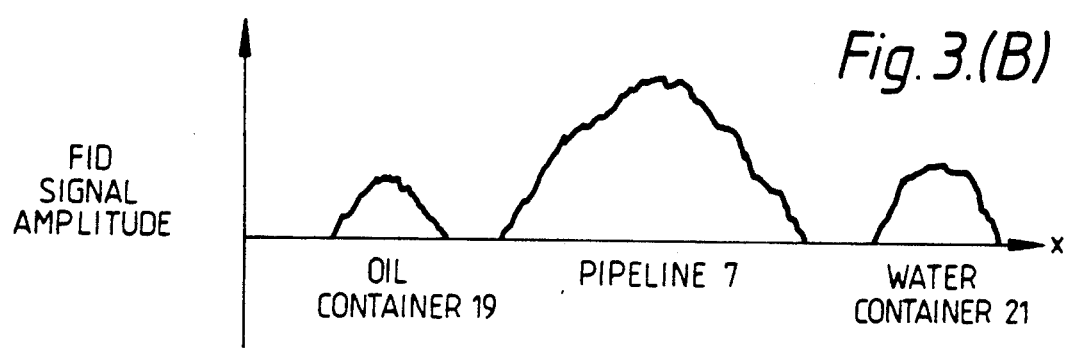
Figure 3:
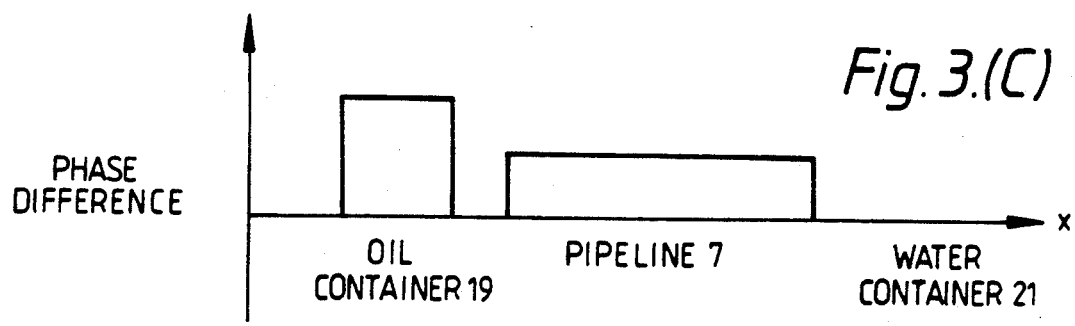

In the computer 13 the detected signals are fourier transformed in known manner to determine the relative amplitudes of the components of the detected signals of different frequencies, and hence obtain the relative amplitudes of components of the signals arising from different locations along a line extending though the pipeline 7 and containers 19 and 21 in the x-direction, as illustrated in FIG. 3B.

It will be appreciated that due to the chemical shift of hydrogen between oil and water the signals arising from the containers 19 and 21 differ in phase, the amount of this difference depending not only on the amount of the chemical shift, (3.5 p.p.m.) but also on the time elapsing between excitation and detection.

The experimental sequence described above is repeated with the time delay between excitation and detection altered by an amount such that the phase difference A between the signals obtained for the oil in container 19 in the first and second experiments is different from the phase difference B obtained for water in the container 21 by a predetermined nominal amount $\phi$, e.g. 90° or 180°.

The phase difference C between the signals arising from the material in the pipeline 7 in the first and second experiments is then measured and the amount $\phi$ by which the phase difference C differs from the phase difference B is computed as a fraction of the phase difference $\phi$. Clearly, this fraction varies from 0 to 1 as the composition of the material in the pipeline varies from 100% water to 100% oil, so that the value of this fraction indicates the proportions of oil and water in the pipeline. This is illustrated in FIG. 3C where the phase differences are normalized to the phase of the signal for water in container 21.

Where as is frequently the case, some space within the pipeline 7 is occupied by material other than oil or water, e.g. by sand or gas, a measure of the volume of such other material may be obtained by measuring the total proton density in the pipeline, i.e., the total resonance signal, and comparing this with the density which would be obtained if the pipeline were full of the oil and water mixture with no other material present.

In addition to being used to measure the proportions of oil and water in the material in the pipeline, the apparatus may also be used to obtain a measure of the rate of flow of material in the pipeline. For this purpose a gradient will normally be required to be imposed by the coil system 9 in the z-direction, i.e. the direction of flow in the pipeline 7. Suitable techniques for such flow measurement are well known in the magnetic resonance imaging art, see for example, in an article by Bryant D.J., Payne J., Firmin D.J., and Longmore D.B. in Journal of Computer Assisted Tomography, Volume 8(1984), pages 58 to 593.

This method makes use of a well known frequency selective r.f. excitation technique described, for example, in an article by Hore P.J. in Journal of Magnetic Resonance Vol. 55(1983) page 283. This technique makes use of groups of r.f. pulses which are equally spaced in time and weighted in respect of their amplitudes, and hence the angles through which they tip the spins of protons, in accordance with Pascal's triangle. By suitable choice of pulse timings and frequencies are, of course, chosen so as to excite hydrogen protons in water, but no in oil, or vice versa.

It may be shown that with a static magnetic field of 0.15T the required interval between pulses in a group for minimum excitation of hydrogen protons in water and maximum excitation of such protons in oil is about 21.5 msec. Of the possible pulse sequences i.e. $\overline{1}1$, $\overline{1}2\overline{1}$, $\overline{1}33\overline{1}$ etc. the sequence $\overline{1}2\overline{1}$ is found to be most practical in the present application.

In performing the method two experimental sequences are carried out. In the first sequence the r.f. pulse group as described above is first applied, without any spatially encoding gradient, to excite resonance of hydrogen protons in oil without exciting water hydrogen protons.

The excited spins are then dephased in known manner by application of a large gradient in the direction of flow (z-direction). This of course destroys the FID signal from the previously excited oil protons.

A conventional non-frequency selective r.f. excitation pulse is then applied in the presence of slice selection gradient in the z-direction. This excites magnetic resonance in the water protons in the selected slice of the pipeline, but not in the oil protons, the signals from which have already been destroyed.

The FID from the excited water hydrogen protons is then detected in the presence of a spatially encoding gradient in one or two directions in the plane perpendicular to the axis of the pipeline, according to whether one or two dimensional spatial discrimination is required. The detected signal is then processed in conventional manner to obtain an output signal representative of the magnitude of the signal from the selected slice of pipeline, which output signal provides a direct measure of the amount of water in the selected slice.

The second sequence is as described above for the first sequence except that in the first step the r.f. pulse group used is effective to excite resonance of the water hydrogen protons without exciting oil hydrogen protons. Consequently the sequence provides a direct measure of the amount of oil in the selected slice.

The relative magnitudes of the output signals for the two sequences give a direct measure of the proportions of oil and water in the pipeline.

It will be appreciated that the second method described by way of example can easily be adapted to provide also rate of flow measurement. Such measurement which typically requires introduction of flow sensitizing gradients between the non-frequency selective r.f. excitation and signal detection, is suitably carried out using methods such as those described in an article by Moran in Magnetic Resonance Imaging 1, 1982, page 197.

In use of the second method, if the rate of flow of material in the pipeline 7 is relatively high, it is possible that by the time the non-frequency selective r.f. excitation third step of each of the two sequences of the method is carried out, some new, un-dephased material of the component whose amount is not being measured by the sequence, may have entered the selected slice, and thus be excited. In this case the signal $S_1$ measured at the end of the first sequence will be $$S_1 = S_o + f(1-\alpha)S_w \quad (1)$$

and the signal $S_2$ measured t the end of the second sequence will be $$S_2 = S_w + f(1-\alpha)S_o \quad (2)$$

where $S_o$ and $S_w$ are the signals providing a measure of the amount of oil and water respectively; $\alpha$ is a fraction of the total amount of water excited in the first sequence or oil excited in the second sequence which is excited in the first step of the sequence; and f is short for $\cos(\sin^{-1}\alpha)^{\frac{1}{2}}$.

The quantities $S_o$ and $S_w$ can then be obtained by solving equations (1) and (2) simultaneously.

To avoid inaccuracies due to resonance offsets and lack of certainty as to the actual value of the resonance, the two sequences may be repeated with the frequencies offset by 180° by changing the time between successive r.f. pulses of the frequency selective first step of the two sequences.

Thus a complete cycle of measurements typically comprises eight sequences, i.e. two sequences, one flow sensitized, at each of four resonant frequencies. These measurements can be taken straight after one another and typically can be completed in about 300 msec.

I claim:

1. A method of determining the proportions of different components of a fluid material in a duct, comprising the steps of: exciting simultaneously in said components nuclear magnetic spins of nuclei of a species common to said components; detecting a resultant free induction decay (FID) signal comprising the sum of signals produced by the spins excited in each of said components; and measuring the phase of said resultant (FID) signal relative to a phase datum, said phase indicating said proportions.

2. A method according to claim 1 wherein there are two of said components and said exciting, detecting and measuring steps are performed in a first experiment with a first time delay between the exciting and detecting steps and in a second experiment with a second time delay between the exciting and detecting steps which differs from said first time delay by a predetermined amount, said proportions being indicated by a phase difference between the resultant signals of the first and second experiments.

3. A method according to claim 2 wherein said indication of said proportions is obtained by computing the amount by which the phase difference between the resultant signals differs from the phase difference between the resultant signals which would occur if said material consisted entirely of one of said components as a fraction of the amount by which the phase difference between said resultant signals would change if the material in said duct changed from consisting entirely of one component to consisting entirely of the other component.

4. An apparatus for determining the proportions of different components of a material in a duct, comprising: means arranged to excite simultaneously in said components in a region of the duct nuclear magnetic spins of nuclei of a species common to said components; means arranged to detect a resultant free induction decay (FID) signal comprising the sum of the signals produced by the spins excited in each of said components; and means for measuring the phase of said resultant signal thereby to obtain an indication of said proportions.

5. A method according to claim 1 wherein one of said components is water and another of said components is oil.

6. A method according to claim 1 including determining the rate of flow of said material in said duct.

7. An apparatus according to claim 4 wherein said means arranged to excite includes a permanent magnet arrangement which provides a static magnetic field in a gap between a pair of pole pieces of the magnet arrangement, and said duct extends through said gap in a direction perpendicular to the direction of the magnetic field.

8. An apparatus according to claim 4 including samples of said at least two components disposed alongside said region of the duct for excitation with the material in said region of the duct, the signals from said samples being detected by said means arranged to detect and being used to provide a phase datum for said indication.

* * * * *